United States Patent [19]

Shibata et al.

[11] Patent Number: 4,827,118

[45] Date of Patent: May 2, 1989

[54] LIGHT-SENSITIVE DEVICE HAVING COLOR FILTER AND MANUFACTURING METHOD THEREOF

[75] Inventors: Yoshitaka Shibata, Itami; Sadafusa Tsuji; Kenji Takada, both of Osaka, all of Japan

[73] Assignee: Minolta Camera Kabushiki Kaisha, Osaka, Japan

[21] Appl. No.: 71,797

[22] Filed: Jul. 9, 1987

[30] Foreign Application Priority Data

| Jul. 10, 1986 | [JP] | Japan | 61-162829 |
| Jul. 10, 1986 | [JP] | Japan | 61-162830 |
| Jul. 28, 1986 | [JP] | Japan | 61-178514 |
| Sep. 9, 1986 | [JP] | Japan | 61-213456 |

[51] Int. Cl.$^4$ .................. H01J 40/14; G01J 3/50; H01L 27/14
[52] U.S. Cl. .................. 250/211 J; 250/226; 357/30; 350/339 F
[58] Field of Search ............ 250/226, 578, 211 J, 250/211 R; 357/30; 350/339 F, 30 L

[56] References Cited

U.S. PATENT DOCUMENTS

| 4,522,691 | 6/1985 | Suginoya et al. | 204/18.1 |
| 4,593,977 | 6/1986 | Takamatsu et al. | 350/339 F |
| 4,621,443 | 11/1986 | Weinreich | 40/436 |
| 4,654,536 | 3/1987 | Saito et al. | 250/226 |
| 4,700,080 | 10/1987 | Fukaya et al. | 250/578 |
| 4,714,636 | 12/1987 | Yokono et al. | 350/339 F |
| 4,724,323 | 2/1988 | Fukaya et al. | 250/370 G |
| 4,727,407 | 2/1988 | Nobue et al. | 357/30 L |

FOREIGN PATENT DOCUMENTS

| 59-4259 | 2/1984 | Japan . |
| 60-53038 | 3/1985 | Japan . |
| 60-184202 | 9/1985 | Japan . |
| 60-184203 | 9/1985 | Japan . |
| 60-184204 | 9/1985 | Japan . |
| 60-237403 | 11/1985 | Japan . |
| 60-52583 | 11/1985 | Japan . |
| 61-77804 | 4/1986 | Japan . |

*Primary Examiner*—David C. Nelms
*Assistant Examiner*—Michael Messinger
*Attorney, Agent, or Firm*—Price, Gess & Ubell

[57] ABSTRACT

There is disclosed a light-sensitive device comprising: at least one light-sensitive element having a surface for receiving an incident light, and at least one color filter made from polyimide resin mixed with an organic pigment, applied on the light-receiving surface of the light-sensitive element. There is also disclosed a manufacturing method of a light-sensitive device having one or more light-sensitive regions, comprising the steps of:

(a) applying at least one color filter layer on the light-receiving surface of a light-sensitive region formed on a wafer of a semiconductor material, said layer being made from a polyimide resin containing an organic pigment;
(b) dicing said wafer into individual chips;
(c) bonding one of said chips to a lead frame member having electrical lead means;
(d) bonding electrical wires between the chip and said electrical lead means of said lead frame member for the connection to at least one external device; and
(e) molding said chip bonded to said lead frame members with a resin.

53 Claims, 11 Drawing Sheets

LIGHT-SENSITIVE DEVICE HAVING COLOR FILTER AND MANUFACTURING METHOD THEREOF

BACKGROUND OF THE INVENTION

1. Field of the Invention

The present invention relates to a light-sensitive device having a color filter such as a color solid image sensor and a spectrum detector for spectroscopic measurement. The term "a light-sensitive device" means a detector that responds to radiant energy.

2. Description of the Prior Art

A light-sensitive device having color filters has been proposed wherein color filters of organic film are applied directly on the surface of a chip of light-sensitive device of semiconductor, each of which is made from a dye base material such as gelatin, casein or polyvinyl alcohol having been dyed. In such a prior art light-sensitive device, filters of on-chip type are applied directly on the surface of a chip of a light-sensitive element. The filter comprises three kinds of color filters which transmit lights of red, green and blue, respectively. Each of the three color filters is arranged on one of the surfaces of three light-receiving parts of the light-sensitive element so that the color distribution of a light to be received can be measured. An infrared rays cut-off filter is arranged in front of the light-sensitive element in order to cut off light components in the infrared region. A diffuser plate is arranged in front of the infrared rays cut-off filter in order to disperse an incident light to be detected so as to make the color distribution uniform on the surface of the light-sensitive element. Such a light-sensitive device having the color filter of on chip type as mentioned above has advantages of simple structure and low cost when compared with a light-sensitive device wherein three color filters are positioned and stuck individually on a chip.

An above-mentioned color filter made of organic film having been dyed has a disadvantage in that the dye base material and dyes deteriorate and fade out by ultraviolet rays so as to cause secular changes in the spectroscopic characteristics thereof. Therefore, it is necessary to put an ultraviolet rays cut-off filter in front of the color filter.

Further, a prior art color filter of organic film having been dyed is inferior in heat resistance. Therefore, when such a color filter is used as a color filter for a light-sensitive device, restrictions on heating it should be taken into account during manufacturing processes to be carried out after the color filter has been applied. That is, since, in the manufacturing processes of a semiconductor light-sensitive device having a color filter, assembly processes such as die bonding, wire bonding and resin molding accompanied with heating the color filter should be done after mounting it, thermal conditions in individual processes are restricted due to the heat resistance of the color filter.

Still further, a prior art color filter of organic film dyed is inferior in moisture resistance because the dye is soluble in water generally.

Further, ammonium bichromate is added usually in order to assist dyeing in a dyeing process of dye base material such as gelatin, casein or polyvinyl alcohol with a dye. Thus, waste liquor should be processed because heavy metals are contained in the waste liquor.

As is apparent from the fact mentioned above, it is desirable to employ such a wire bonding process of a semiconductor chip element that does not need heating. Among conventional wire bonding processes, a supersonic process does not need heating of a substrate especially because bonding wires of aluminum is bonded under ultrasonic vibrations. However, this method has a disadvantage in that bonding strength obtained is not enough since aluminum wires used as bonding wires have a relatively large surface roughness and are liable to corrode.

All of other wire bonding processes such as thermocompression bonding process, thermosonic process and laser process accompany heating. In thermocompression and thermosonic processes, gold wires or copper wires are used as bonding wires, and they are bonded to a chip due to heat and load in the former process and due to heat, load and supersonic vibrations in the latter process, respectively. Thus, both of these processes inevitably accompany the heating of a substrate. The temperature of the heated substrate is between 300° and 350° C. in the thermocompression process and between 150° and 250° C. in the thermosonic process. Because the thermocompression process needs a higher temperature than the thermosonic process, the former is not recently used so often. On the other hand, the thermosonic process needs heating of the substrate up to a temperature between 150° and 250° C. though the temperature is lower than the counterpart of the thermocompression process. If an element to be bonded is only a silicon semiconductor chip, there arises no thermal problem practically. However, if components of lower heat resistance are applied on the chip, they are liable to deteriorate in the bonding process. Laser bonding process wherein a laser beam is irradiated on a spot to be bonded also accompanies heating.

If a light-sensitive device having the color filter of organic film as mentioned above can be bonded to electrical connection parts by using a wire bonding process accompanying heating, a light-sensitive chip element can be provided at a low cost and at a high package density.

However, a wire bonding process which needs heating the substrate up to a temperature mentioned above cannot be used for a prior art color filter of organic film of low heat resistance. In other words, a prior art color filter, which is prepared by dyeing a dye base material such as gelatin, casein or polyvinyl alcohol with a dye, deteriorates at a temperature lower than the above-mentioned operating condition of temperature because these materials have low heat resistance (at about 140° C. at most), and characteristics as a color filter are varied.

Resin molding method has been used widely for packaging a semiconductor device. Packaging with use of resin molding method has advantages such as good moisture resistance, high reliability and low cost. Because the operating condition of temperature during the resin molding process is between 150° and 180° C., no problems occur practically if an object to be packed is only a semiconductor chip of silicon.

A reliable and inexpensive device will be provided if an above-mentioned light-sensitive chip having a color filter of organic film of on-chip type could be molded with transparent resin by using the above-mentioned resin molding method. Further, a reliable and inexpensive device which needs no diffuser plate will be provided if a milk-white resin is used in the resin molding process instead of transparent rein. However, the resin molding process which needs the above-mentioned operating condition of temperature cannot be adopted because a prior art color filter of organic film has low heat resistance as mentioned above.

SUMMARY OF THE INVENTION

It is an object of the present invention to provide a light-sensitive device having a color filter of improved light resistance and heat resistance.

It is another object of the present invention to provide a light-sensitive device having a color filter which can be bonded electrically with a thermal wire bonding process without deteriorating optical characteristics.

It is a further object of the present invention to provide a light-sensitive device having a color filter molded with a transparent resin.

It is a still further object of the present invention to provide a milk-white resin.

It is an additional object of the present invention to provide a manufacturing method of a light-sensitive sensor having a color filter without deteriorating optical characteristics.

A light-sensitive device according to the present invention comprises: at least one light-sensitive element having a surface for receiving an incident light, and a color filter made from polyimide resin mixed with an organic pigment, applied on the light-receiving surface of the light-sensitive element.

A manufacturing method of a light-sensitive device according to the present invention comprises the steps of:

(a) applying at least one color filter layer on the light-receiving surface of a light-sensitive region formed on a wafer of a semiconductor material, said layer being made from a polyimide resin containing an organic pigment;

(b) dicing said wafer into individual chips;

(c) bonding one of said chips to a lead frame member having electrical lead means;

(d) bonding electrical wires between the chip and said electrical lead means of said lead frame member for the connection to at least one external device; and (e) molding said chip bonded to said lead frame members with a resin.

An advantage of a light-sensitive device according to the present invention is that the heat-resistance and the moisture resistance are improved by using color filters of polyimide resin having organic pigments.

An advantage of a manufacturing method of a light-sensitive device according to the present invention is that thermal restrictions on the steps (c) and (d) decrease remarkably due the heat-resistance of the color filter layers.

BRIEF DESCRIPTION OF THE DRAWINGS

The invention will now be described with reference to the accompanying drawings wherein.

FIGS. 6(a)-(e) are successive schematic sectional views of a light-sensitive chip in the processes of applying a color filter;

FIGS. 12(a)-(d) are sectional views of chip which show successively the processes of coating a top coat film;

FIGS. 17(a)-(d) are schematic elevational views of successive processes of the wire bonding according to the thermosonic process;

DETAILED DESCRIPTION OF THE PREFERRED EMBODIMENTS

Referring now to the drawings wherein like reference characters designate corresponding parts throughout several views, preferred embodiments will be described now.

Figure 1:
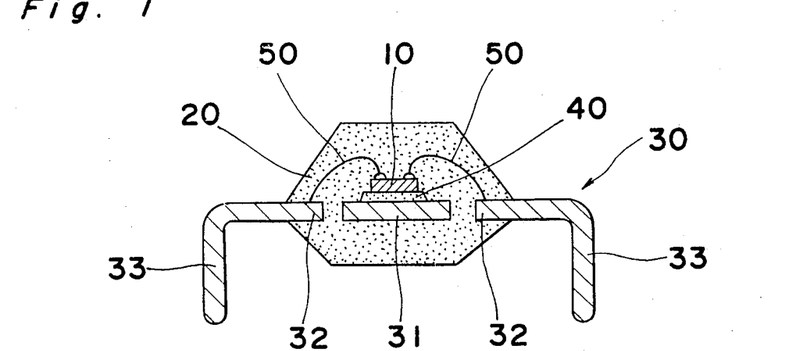
FIG. 1 is a schematic sectional view of a light-sensitive device.

FIG. 1 shows a light-sensitive chip 10 which is molded with a transparent resin 20. The light-sensitive chip of an element which can convert a light signal to an electric signal (a voltage or a current), for example, a photodiode, a photoresistor, a phototransistor or a photovoltaic cell. Details of the properties and the manufacturing processes are well known so that detailed explanation about the light-sensitive chip is omitted here. Color filters 3, 4, 5 of red, green and blue made from polyimide resin (refer FIG. 4) are applied on the light-receiving surface of the light-sensitive chip 10, as will be explained below. The light-sensitive chip 10 is bonded with a layer 40 of an electrically conductive bonding agent on a tab 31 which is located at the center of a lead frame 30 shown in FIG. 2 by using a die bonding process. An end of an bonding wire 50 is connected to each inner lead terminal 32 of the lead frame 30, while the other end of a bonding wire 50 is connected to each bonding pad of the light-sensitive chip 10. Each outer lead 33 of the lead frame 30 which is connected electrically to the corresponding inner lead 32 is a lead of the light-sensitive chip 10 to an external device.

Figure 3:
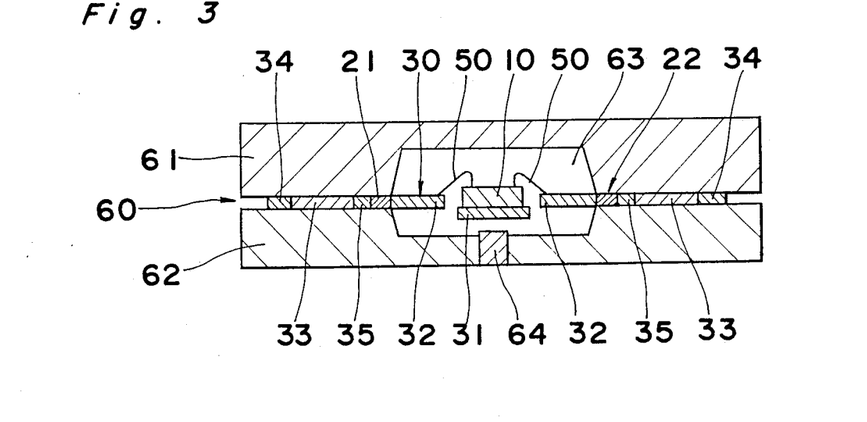
FIG. 3 is a schematic sectional view of a metal mold interposing a lead frame.

FIG. 3 shows an example of a metal mold 60 in the molding of the light-sensitive chip 10 with the transparent resin 20. The metal mold 60 consists of an upper mold 61 and a lower mold 62, both forming a cavity 63 between them. After the die and wire bondings, the light-sensitive chip 10 put on the lead frame 30 is placed in the cavity so that outer leads 33 are interposed between the molds 61, 62. Next, transparent resin is injected into the cavity 63 fully.

Next, the transparent resin is hardened by heating it at an operating temperature below 150° C. The mold package thus formed has an outer shape in correspondence to the shape of the cavity 63. Then, the upper mold 61 is separated from the lower mold 62 to which the transparent resin attaches. Then, the mold package is taken out from the mold 62 by moving an ejecter pin 64 up.

After the mold package is formed, the frames 34 and tie bars 35 become unnecessary so that they are cut off. Flashes of the injected transparent resin 20 forced out from the cavity 63 to between the outer leads 33 and to over and below the outer leads 33 are also cut off because they are also unnecessary. Then, the outer leads 33 are bent so as to form a dual in-line package, as shown in FIG. 1.

Figure 4:
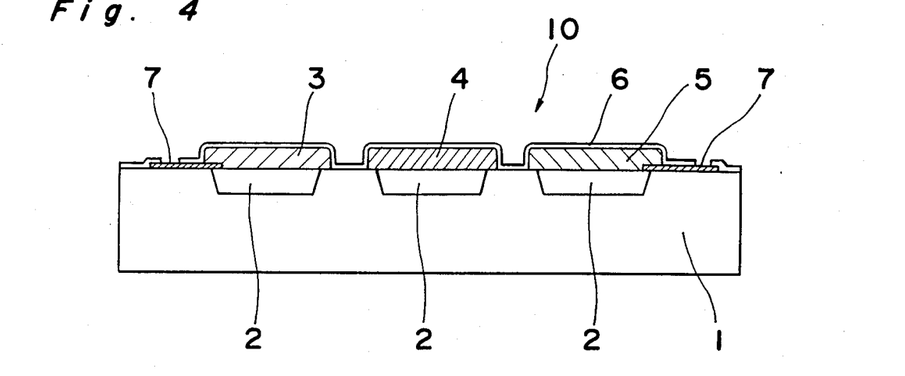
FIG. 4 is a schematic sectional view of a light-sensitive chip.

FIG. 4 shows a cross-section of an example of a light-sensitive chip 10 to be molded with a transparent resin. This light-sensitive chip 10 can measure the light intensity of red (R), green (G) and blue (B) so that it can be used as a white balance sensor for a color video camera. On a surface of a silicon substrate 1, light-sensitive regions 2 and wiring areas 7 of aluminum film are formed by using conventional semiconductor manufacturing process. A red filter 3, a green filter 4 and a blue filter 5 each cover three light-receiving surfaces of the light-sensitive regions 2 and adjacent area thereof, and a top coat film 6 is applied on the surface of the chip including the surfaces of the filters 3–5 so as to make the surfaces flat. On the other hand, the wiring areas 7 of the aluminum film, for example of an electric power source line, a ground line, an output line, or an off-set control line, are exposed at the rim area of the silicon substrate 1 for the wiring process.

Figure 6:
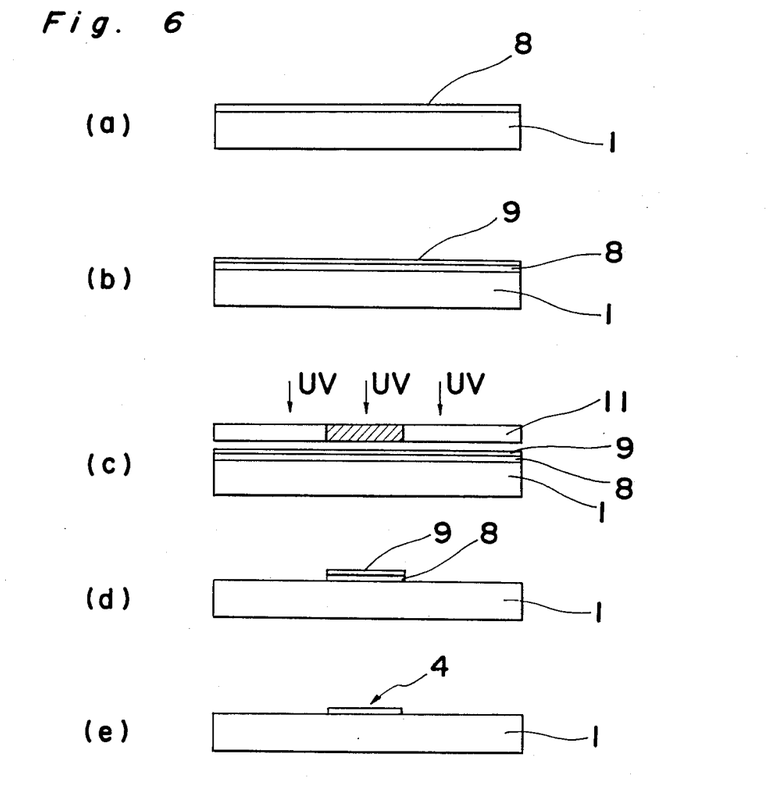
Figure 7:
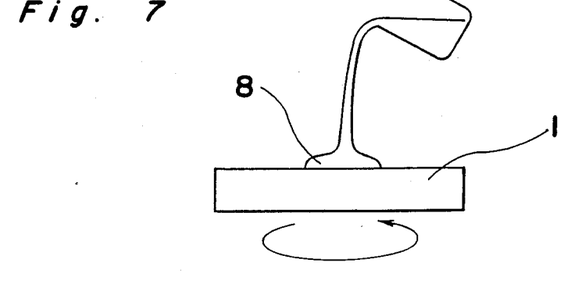
FIG. 7 is a schematic view of the coating of color
Figure 12:
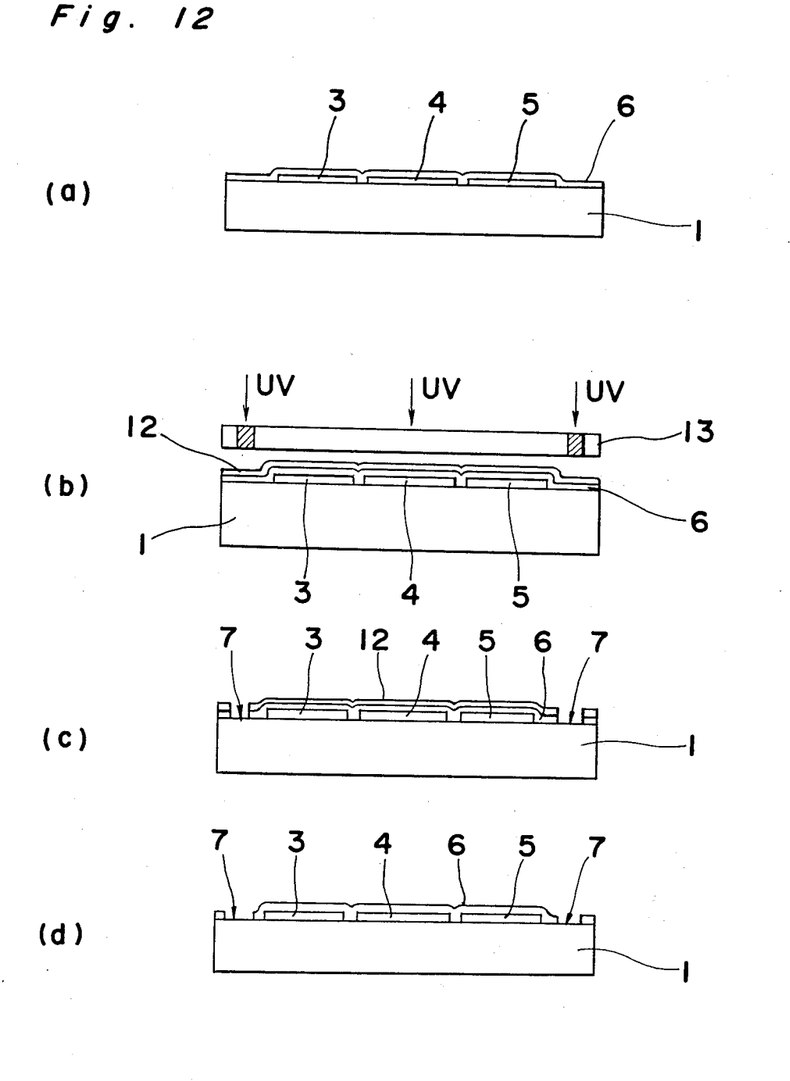

The processes for manufacturing the color filters will be explained with reference to a flowchart shown in FIG. 5 and explanatory FIGS. 6, 7 and 12. It should be noted that the processes shown in FIGS. 6, 7 and 12 are treated in the unit of a wafer through FIGS. 6, 7 and 12 display only one chip and that wirings are omitted for simplicity.

Figure 5:
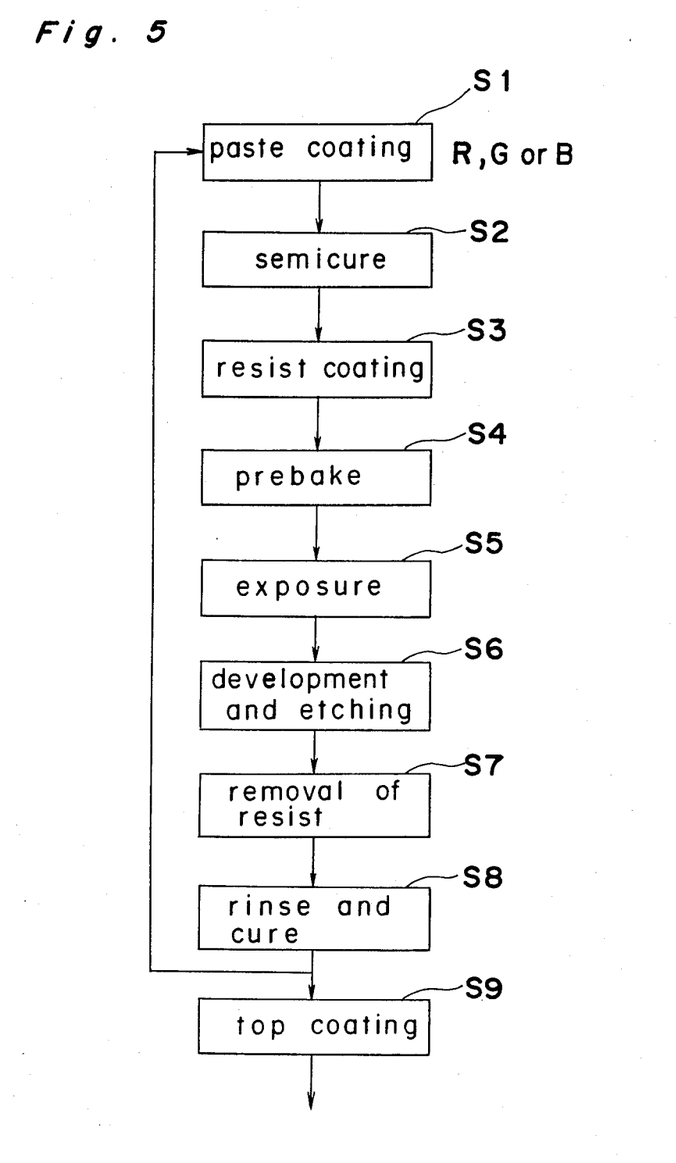
FIG. 5 is a flowchart of manufacturing processes of a light-sensitive chip.

(1) Coating of color paint and semicure (steps S1 and S2 in FIG. 5; refer FIG. 6(a))

Figure 8:
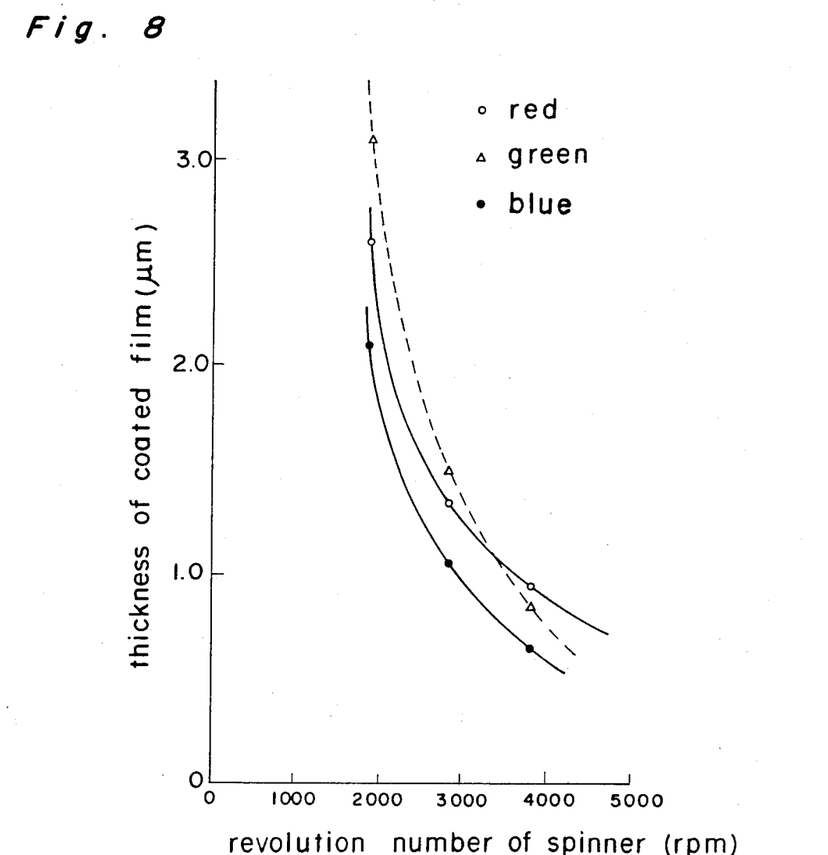
FIG. 8 is a graph of the revolution number dependence of the thickness of coated film.

First, heat-resistant color paste 8 for a color filter 3, 4 or 5 is applied on a surface of the silicon substrate 1 wherein heat-sensitive regions 2 have been formed. At this step, the silicon substrate 1 is processed in the unit not of an individual chip, but of a wafer. The heat-resistant color paste 8 consists of a solvent, an organic pigment insoluble in the solvent and a polymer precursor. On the coating, the silicon substrate 1 on which the light-sensitive regions 2 are formed is dried first in $N_2$ gas at 200° C. during ten minutes. Then, a small amount of the color paste 8 of the first color is dropped down on the surface of the silicon substrate 1 for example from a beaker as shown in FIG. 7. The silicon substrate 1 is rotated with a spinner (for example, a spinner "IH-DS" produced by Mikasa Co., Ltd.). Then, the paste 8 spreads uniformly on the surface of the silicon substrate 1 due to the centrifugal force so as to form a film as shown in FIG. 6(a). The thickness of the film becomes thinner with increase in the revolution number of the spinner as shown in FIG. 8 wherein the marks of circle (○), triangle (Δ) and solid circle (●) represent the color of the paste of red, green and blue respectively. In this embodiment, the silicon substrate is rotated first at 500 rpm number during five seconds and then at 3,000 rpm during thirty seconds. The first color of the color paste 8 may be any of red, green and blue.

Examples of the components of the heat-resistant color paste used in the coating process are as follows:

(a) Heat-resistant color paste (I)

A mixture in the ratio of 100 g of polymer of a general formula wherein $R_1$ represents an aromatic hydrocarbon nucleus of aromatics or a heterocyclic nucleus and $R_2$ represents a hydrogen atom or a hydrocarbon group of the number of carbon from one to ten, and 10 to 300 g of organic pigment which may be any of quinacridone pigment as red pigment such as pigment Red 209 of color index No. 73905 or pigment Violet 19 of color index No. 46500, phthalocyanine green pigment as green pigment such as pigment Green 36 of color index No. 74160 or pigment Green 7 of color index No. 74260, and phthalocyanine blue pigment as blue pigment such as pigment Blue 15-3 of color index No. 74160 or pigment Blue 15-4 of color index No. 74160.

(b) Heat-resistant color paste (II)

A mixture in the ratio of 100 g of polymer of a general formula wherein $R_3$ represents an aromatic hydrocarbon nucleus or a heterocyclic nucleus, and $R_4$ represents a hydrogen atom or a hydrocarbon group of the number of carbon from one to ten, and 10 to 300 g of organic pigments of any of the above-mentioned red, green and blue pigments used for Heat-resistant color paste (I).

(c) Heat-resistant color paste (III)

A mixture in the ratio of 100 g of polymer of a general formula wherein $R_5$ represents an aromatic hydrocarbon nucleus or a heterocyclic nucleus and $R_6$ represents a hydrogen atom or a hydrocarbon group of the number of carbon from one to ten, and 10 to 300 g of organic pigments of any of the above-mentioned red, green and blue pigments used for Heat-resistant color paste (I).

The polyimide resin and the organic pigment used for the color filter is hard to be deteriorated by ultra-violet rays. Then, the resistance to the ultra-violet rays of a color filter is improved and the spectroscopic characteristics of a color filter nearly change with the passage of time. Thus, an ultra-violet rays cut-off filter can be omitted.

A transparent polyimide layer may be applied on the surface of the light-sensitive regions 2 in order to even the irregularities of the surface before the color paste 8 is applied.

After the color paste 8 is applied, it is kept for semicure in air at 140° C. during thirty minutes in an air drier.

(2) Coating of resist and prebake (steps S3 and S4 in FIG. 5; refer FIG. 6(b)).

After the silicon substrate 1 is taken out after the semicure from the air drier and is cooled down, a photoresist 9 is applied on the color paste 8 as shown in FIG. 6(b). In this embodiment, Microposit Photoresist "1400—31" which is the name of a posiresist of Shipley Co., Ltd. is used. The photoresist 9 is also applied by using a spinner which is driven at the revolution number of 500 rpm during five seconds and further at the revolution number of 2,000 rpm during thirty seconds.

Prebake (step S4) is processed by keeping the chip 1 coated with the photoresist 9 in nitrogen gas at 90° C. during thirty minutes.

(3) Exposure (step S5 in FIG. 5; refer FIG. 6(c))

Next, the exposure position of the silicon substrate 1 is adjusted with a mask aligner. Then, the silicon substrate 1 is exposed to ultraviolet rays (UV) of 70 mJ through a photomask 11 which acts so that the photoresist 9 is exposed on and around the photo-sensitive region 2 to be applied with a color filter.

(4) Development and etching of photoresist (step S6 in FIG. 5; refer FIG. 6(d))

After the exposure completes, the photoresist 9 of the silicon substrate 1 is developed. The photoresist 9 is kept at 22° C. during sixty seconds in a development liquid which is composed of water and Microposit Developer "MF-312" produced by Shipley Co., Ltd., each in the ratio of 1:1.

Then, the unnecessary part of the color past 8 is etched away.

After the etching, the silicon substrate 1 is rinsed with water and is dried by blowing nitrogen gas.

(5) Removal of photo resist, and rinse and cure (step S7 and S8; refer FIG. 6(e))

In order to remove the remaining photoresist 9 on the color paste 8, the silicon substrate 1 is immersed in ethyl acetate and is agitated. The silicon substrate 1 is taken out after five minutes. Then, it is rinsed with isopropyl alcohol, and is dried by blowing nitrogen gas to it. Then, it is cured in nitrogen gas at 300° C. during thirty minutes in the air drier.

Though a posiresist is used as the photoresist 9 in this embodiment, a negaresist (for example, Negative Photoresist "RU-1000N" of Hitachi Chemical Co. Ltd.) may also be used.

(6) Process of manufacturing a color filter of the second color

Next, a color filter of the second color will be manufactured by iterating the processes (1)–(5) similarly. The second color may be any of the remaining two colors of red, green and blue except the first color. For example, if the first color is green, the second color may be red.

(7) Process of manufacturing a color filter of the third color

Next, a color filter of the third color will be manufactured by iterating the processes (1)–(5) similarly. The third color is the remaining color of red, green and blue except the first and second colors. For example, if the first color is green and the second color is red, the third color is blue.

Thus, color filters 3, 4, 5 each of different colors can be applied on a plurality of light-receiving surfaces of the light-sensitive regions 2 of a light-sensitive chip 10 by iterating the above-mentioned photolithography process with use of color pastes which contain organic pigments of different colors. Then, a light-sensitive chip 10 for spectroscopic detection which has spectroscopic characteristics governed mainly by the species of the organic pigment contained in each color filter can be manufactured.

Figures 9, 10:
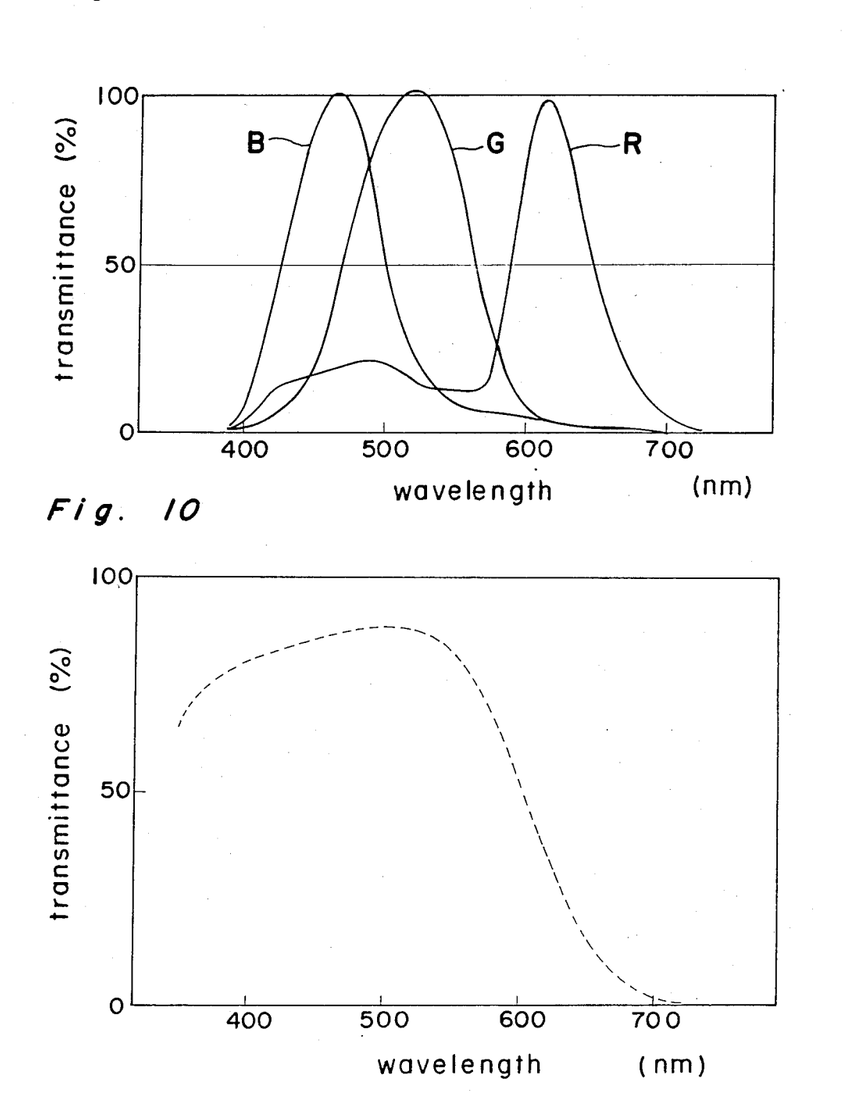
FIG. 9 is a graph of the characteristics of blue, green and red filters.
FIG. 10 is a graph of the characteristics of an infrared rays cut-off filter.

FIG. 9 shows spectral characteristics of examples of color filters 3, 4, 5 of blue (B), green (G) and red (R) applied on a silicon chip. These characteristics are measured with use of an infrared rays cut-off filter which has characteristics shown in FIG. 10.

Figure 11:
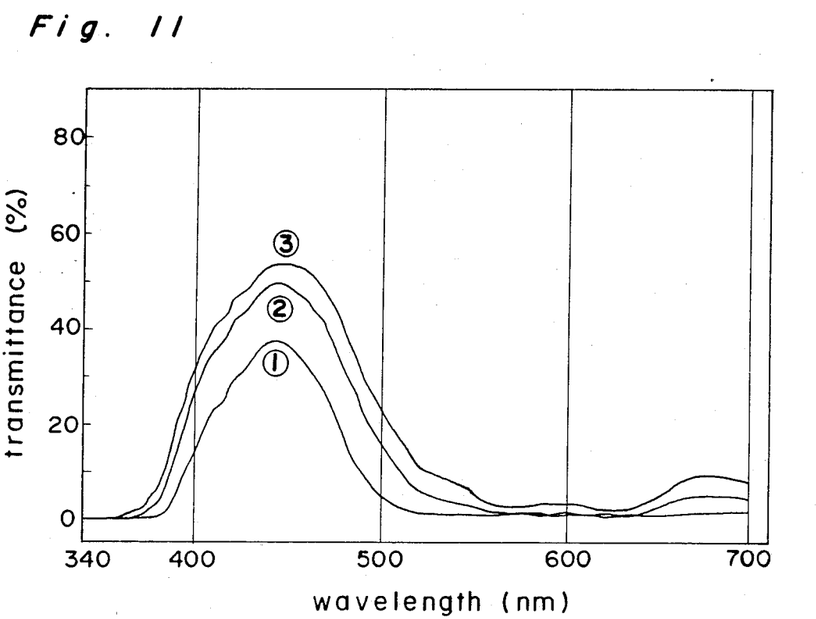
FIG. 11 is a graph of the thickness dependence of the transmittance of blue color filter.

FIG. 11 shows the thickness dependence of he transmittance of blue color filter, wherein the reference numbers ①, ②, ③ films which are applied with a spinner at the final revolution numbers of 2000 rpm, 3000 rpm and 4000 rpm, respectively. The transmittance increases with increase in the final revolution number which corresponds to the decrease in the thickness of a film.

Irregularities of so-called orange peel happen often on the surface of a color filter or polyimide manufactured with processes (1)–(7) as mentioned above so that the light transmittance is liable to lower due to random reflection on the surface. Then, a top coat film 6 is applied on the color filters 3, 4, 5 in order to prevent random reflection on the surface so as to improve the light transmittance due to the flattening of the surface by using following processes shown in FIGS. 12(a)–(d).

(8) Coating of top coat film (step S9 in FIG. 5; refer FIG. 12(a))

After color filters 3, 4, 5 of three colors are formed on the same silicon substrate 1, a top coat film 6 is formed by coating polyimide (for example, JSR Polyimide "JIA-1-2" of Japan Synthetic Rubber Co. Ltd.) of thickness of 0.5 $\mu$m and by baking the applied film at 150° C. during one hours. The top coat film 6 may also be formed for example with a surface flattening agent "JSS-17" of Japan Synthetic Rubber Co. Ltd.

(9) Coating of a photoresist (refer FIG. 12(b))

In order to expose leads of aluminum film 7, which have been covered with the top coat film 6 in the process (8) in order to form bonding pad areas, a photoresist film 12 is formed on the top coat film 6. The leads 7 are arranged at the rim of the silicon substrate 1 as shown in FIG. 4.

Then, the photoresist film 12 is exposed to ultraviolet rays (UV) through a photomask 13 which acts to expose the photoresist film 12 only on some parts over the aluminum films 7.

(10) Etching of top coat film (refer FIG. 12(c))

Next, the silicon substrate 1 which has been exposed is developed. Then, it is etched so that some areas of the top coat film 6 on which the resist 12 is etched away are removed selectively.

(11) Removal of Photoresist (refer FIG. 12(d))

Then, the photoresist 12 which covers the top coat film 6 is removed away with ethyl acetate or acetone.

Some areas of the top coat film 6 are removed away by using the successive processes (9)–(11) so as to expose leads of aluminum films 7.

Figure 13:
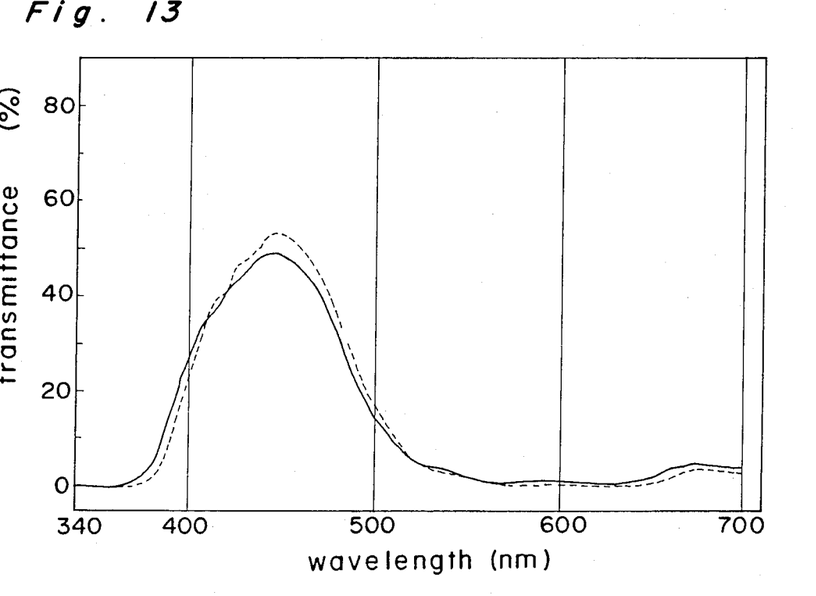
FIGS. 13, 14 and 15 are graphs of the transmittance of color filters of blue, green and red, respectively.
Figure 14:
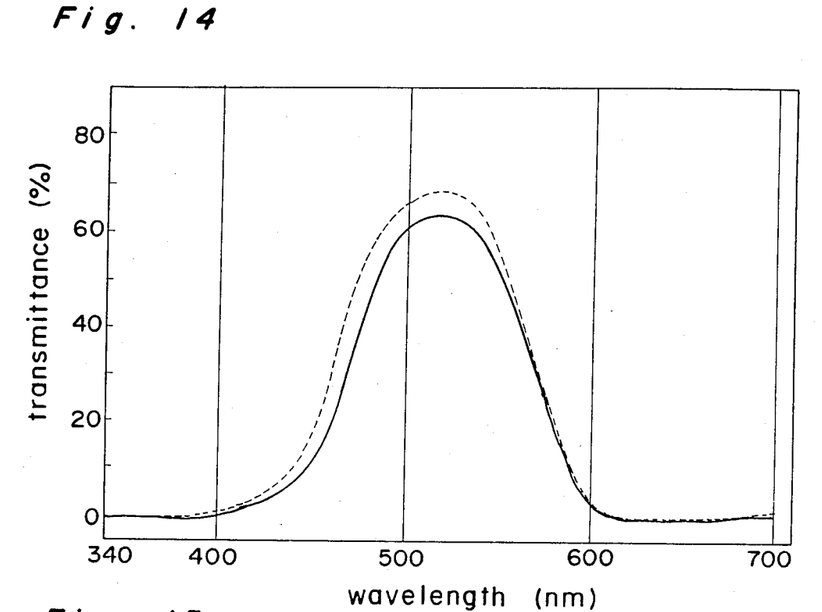
Figure 15:
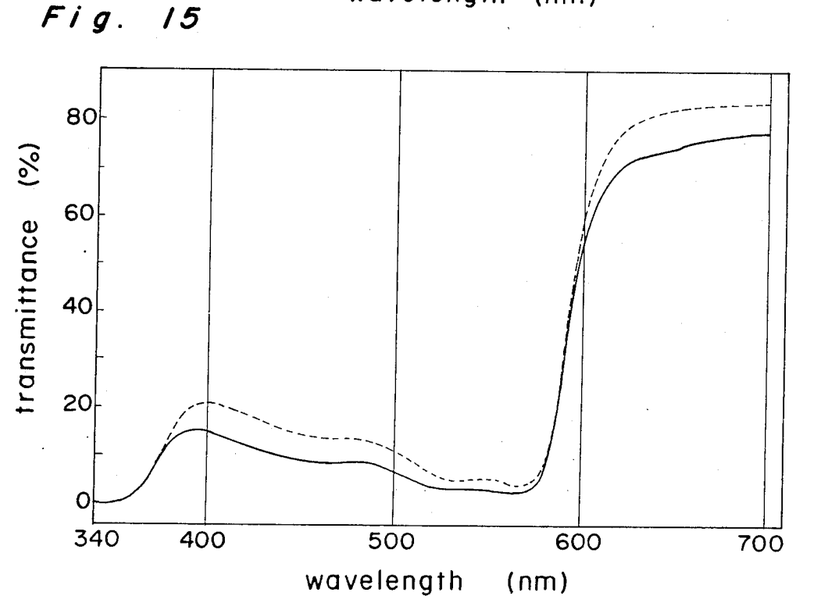

FIGS. 13–15 show the transmittance characteristics of color filters of blue, green and red, respectively. In these Figures, the solid lines and the dashed lines represent color filters with top coat films and with no top coat films, respectively. It is clear that the application of top coat film improves the transmittance by several percent.

A light-sensitive chip 10 manufactured in the above-mentioned processes can resist heating up to 300° C. well because the color filter consists of polyimide resin and organic pigment. Therefore, thermal conditions are not needed to be taken into account in the bonding process and in the molding process which are required in the fabrication of a sensor for spectroscopic detection. Further, it is found that a color filter manufactured in the above-mentioned processes can resist heating up to 400° C. though the chip itself is destroyed. As to the light-resistance, it is found that a color filter manufactured in the above-mentioned process show nearly no secular change because the organic pigment itself is difficult to be faded by ultraviolet rays. Then, an ultraviolet rays cut-off filter can be omitted.

As to the application of color filters on a semiconductor chip, the photolithography process mentioned above is preferable wherein color filters are applied directly on the light-receiving surfaces of the chip. However, color filters can also applied on a semiconductor chip by applying color filters made from polyimide resin containing organic pigment on a light-receiving surface of the chip on a glass substrate with use of a bonding agent, for example, an ultraviolet rays hardener.

(12) Die and wire bondings (refer FIGS. 1-3 and 16-18)

After color filters 3, 4, 5 are applied directly on the wafer, the wafer is tested to be good or not. After dicing a good wafer into individual chips 10, chips only of good quality are bonded on a lead frame 30. A layer 40 of a bonding agent made from electrically conductive epoxy resin is used for the die bonding process. The resin hardens by using the low temperature hardening process. A solder process which needs high temperature can also be adopted.

After the completion of the die bonding, the lead frame 30 with a chip 10 is cured at 100° C. during one hour.

Figure 16:
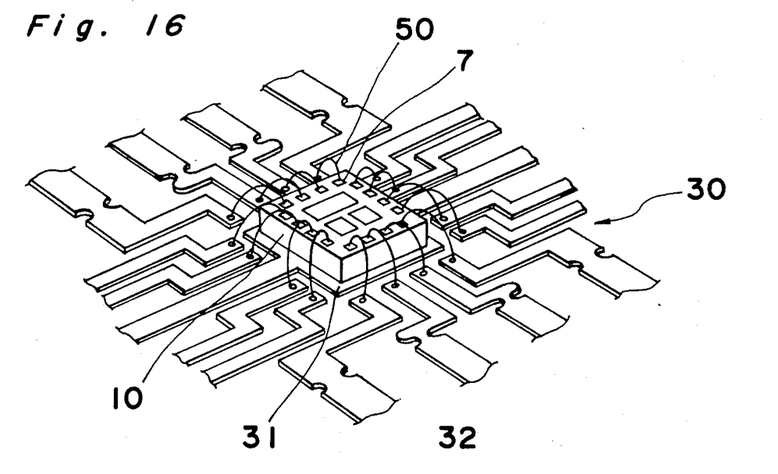
FIG. 16 is a perspective view of a light-sensitive chip after the wire bonding.
Figure 17:
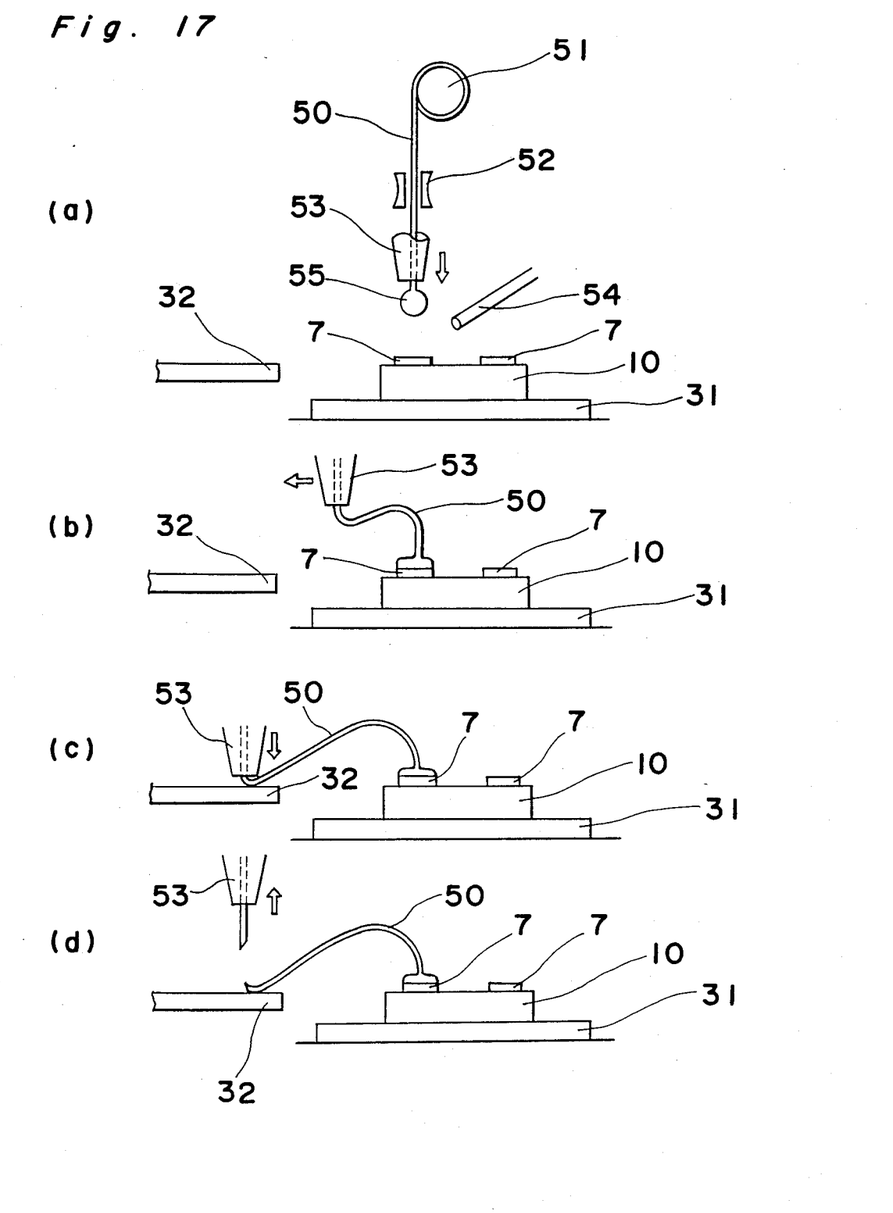

Then, the wires 50 such as gold wires are bonded as shown in FIG. 16. The temperature of the substrate 1 is between 100° and 150° C. on the wiring process. In the wiring process, a chip 10 is mounted on a tab 31 of the lead frame 30. A plurality of bonding pads 7 are formed at the rim of the chip 10. One end of each bonding wire 50 is bonded at a bonding pad 7, while the other end is bonded at an end of an inner lead 32 of the lead frame 30.

The thermosonic process (refer FIGS. 17(a)-(d)) is adopted for the wire bonding. First, a bonding wire 50 wound on a wire spool 51 is clamped with a clamper 52 and is led through a capillary chip 53 above a bonding pad 7. A discharge electrode 54 is set near the end of the bonding wire 50 which is lead out from the capillary chip 33. By generating discharge in argon gas atmosphere, the bottom end of the bonding wire 50 is heated so that a melted ball 55 for bonding is produced as shown in FIG. 17(a). Then, the ball 55 is pressed to the bonding pad 7 of aluminum film so that the bottom end of the bonding wire 50 is bonded at the bonding pad as shown in FIG. 17(b). The chip 10 which has the bonding pad 7 has been heated beforehand between 100 and 150° C. in order to assist the bonding between the melted ball 55 and the bonding bad 7.

Next, the capillary chip 53 is moved to an end of inner lead 22 and is pressed down to the end for wedge bonding, as shown in FIG. 17(c).

Finally, the bonding wire 50 is cut by moving the capillary chip 53 up, as shown in FIG. 17(d). Then, the wire bonding completes, In the thermosonic process, the color filters 3-5 applied on the chip 10 is heated naturally according to the preheating of the chip 10 and the pressing of the ball 35 of melted metal to a bonding pad 7. However, the optical characteristics of the color filters are not affected by the wiring process because the color filters made from polyimide resin having organic pigment has heat-resistance up to about 300° C. The inventors confirmed that the optical characteristic of the color filters do not change when subjected to thermal conditions on bonding processes which are used in conventional processes for manufacturing semiconductor devices.

Wire bonding process other than the above-mentioned thermosonic process may also be adopted.

Figure 18:
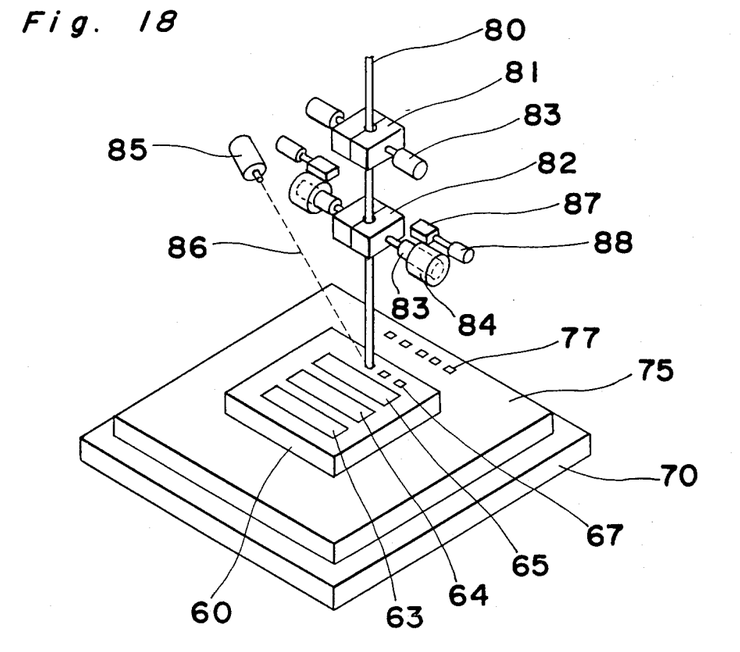
FIG. 18 is a perspective view of a light-sensitive chip under the laser bonding process.

FIG. 18 shows a wire bonding apparatus for the laser bonding process. A light-sensitive chip 60 on which color sensors 63, 64, 65 of blue, green and red are applied directly is bonded on a substrate 75, which is put on a work table 70. The chip 60 has bonding pads 67, while the substrate also has bonding pads 77 on the upper surface in correspondence to the bonding pads 67. The bonding pads 67, 77 are connected with bonding wires 80. A bonding wire 80 is positioned by clampers 81 and 82 drived by actuators 83 and 84, respectively, and the bottom end of the bonding wire 80 is led down to a bonding pad 67 or 77 to be attached. Then a laser application apparatus 85 radiates a laser beam 86 for heating to the bonding pad 67 or 77. Then, the bonding wire 80 is bonded to the bonding pad 67 or 77. Next, a cutter 87 is driven by an actuater 88 in order to cut the bonding wire 80.

In the laser bonding process as mentioned above, the chip 60 and the color filters 63, 64, 65 on the chip 60 are heated on the irradiation of the laser beam 86. However, the color filters 63-65 have heat-resistance up to about 300° C. because they are made from polyimide resin which contains organic pigment. Therefore, the optical characteristics of the filters 63-65 are not affected by the heat on the bonding.

The copper wire bonding process can also be adopted. The ball bonding process which uses gold wires as mentioned above has been used widely for the wiring of a semiconductor chip. However, the gold material of the wire is liable to diffuse to each other with aluminum of the bonding pad material so that intermetallic compounds generated at the pad may cause the isolation of the wire. The copper wire bonding process has no such problem. Furthermore, copper wire bonding has advantages such that the bonding wire of copper is easy to be made fine (down to about 20 $\mu$m of diameter) because the strength is high and the electrical resistivity is lower, and the looping characteristic which is better due to the larger ratio of strength to specific density is advantageous for high-speed bonding. Though the copper wire bonding process needs heating of the substrate at about 280° C., color filters which are made from polyimide resin containing organic pigment has heat-resistance up to about 300° C. so that no thermal problems on the copper wire bonding process arise. The copper wire bonding process proceeds similarly to the gold wire bonding process mentioned above except the temperature of the substrate.

As to a light-sensitive device wherein a glass substrate having color filters is bonded with an ultraviolet-rays hardener on the front surface of a chip, the inventors have confirmed that optical characteristics of the color filters are not affected on heating in the wire bonding conditions used in ordinary processes of semiconductor manufacturing.

Figure 2:
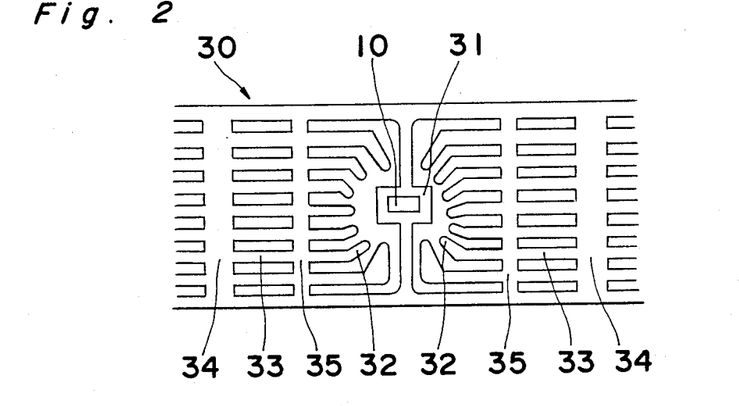
FIG. 2 is a schematic plan view of a lead frame.

(13) Resin molding (refer FIGS. 1–3)

After the completion of wire bonding, the chip is molded with transparent resins such as acrylic resin, epoxy resin or silicon resin with use of transfer molding process. The temperature is as high as about 180° C. at most, so that both organic pigment and polyimide resin of color filters can resist the heating well.

Further, a transparent layer of polyimide resin or epoxy resin may be coated before the resin mold process. This coating can prevent the direct transmission of the inner stress of the molded resin and the heat on the molding.

The package can take any form such as dual in-line package (DIP) single in-line package (SIP) or flat package.

If the resin mold process is adopted in the fabrication of a light-sensitive device according to the present invention, a top coat film is not necessarily needed because the irregularities on the surface of the color filters can be improved with the resin for molding.

There exist various kinds of resin molding processes which will be mentioned below, and any one of them can be selected.

(a) Transfer molding

In this process, powder of resin is melted, and the melted resin is poured into the metal mold. Thus, a plurality of devices can be molded at the same time. A combination of a lead frame of Fe-Ni alloy or copper and epoxy resin or silicon resin is used generally as the material for the bonding. The operating temperature is usually between 150°–170° C., so that color filters of polyimide according to the present invention can resist the heating well.

(b) Injection molding

In this process, polyphenylenesulfide resin or polyester resin is used for molding with an injection molding machine. A lead frame made of Fe-Ni is used. The operating temperature is 150° C. or less, so that color filters of polyimide according to the present invention can resist the heating well.

(c) Casting-potting

In this process, liquid resin is poured into the metal mold at room temperature. This process is used, for example, when a diode lead or a hybrid substrate is molded with silicon resin or epoxy resin. Though the operating temperatures is room temperature, the cure is processed at 180° C. or less. However, color filters of polyimide according to the present invention can resist the heating well.

A ceramics package which has a window for light transmission can also be used instead of the above-mentioned transparent resin molding.

Figure 19:
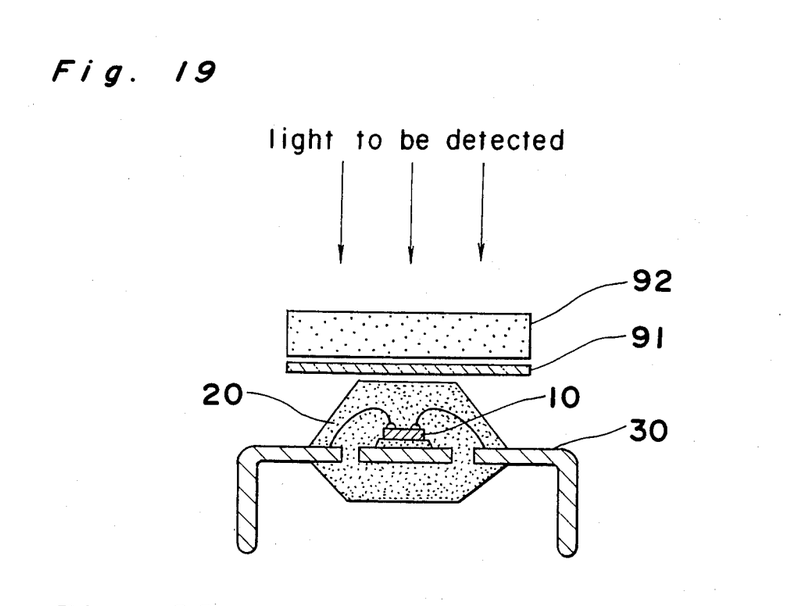
FIG. 19 is a schematic sectional view of a white balance sensor.

When a light-sensitive device manufactured as mentioned above is used as a white balance sensor, an infrared-rays cut-off filter 91 is arranged over the front of the light sensitive element 10 having three color filters 3, 4, 5 in order to cut off light components in the infrared region as shown in FIG. 19. Further, a diffuser plate 92 is arranged in front of the infrared rays cut-off filter 91 in order to disperse light to be detected so as to make the color distribution uniform on the surface of the light-sensitive element 10.

Figure 20:
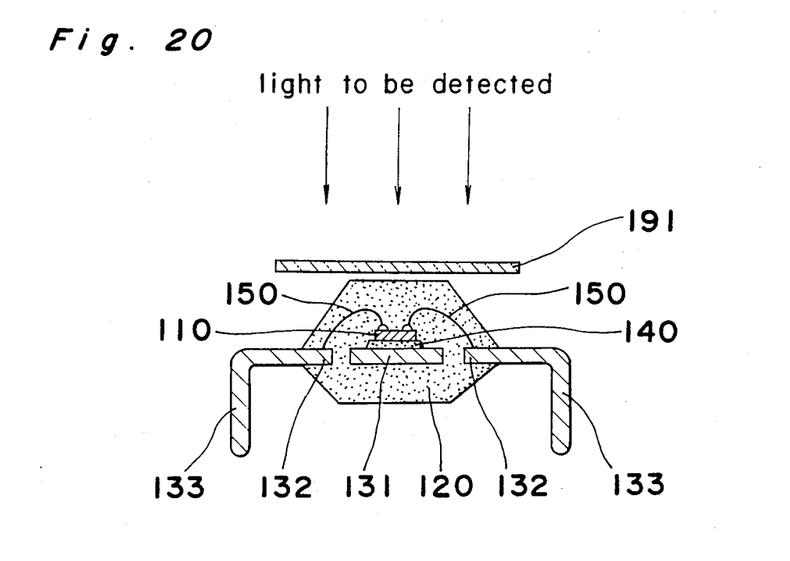
FIG. 20 is a schematic sectional view of another white balance sensor.

FIG. 20 shows another preferred embodiment of a light-sensitive device according to the present invention wherein a milk-white resin is used for the resin molding process. The term "milk-white resin" is used in a comprehensive sense to broadly refer to a resin which can transmit light in a wide range of wavelength in and around the wavelength region of visible light. Processes than the resin molding process is the same as the above-mentioned embodiments.

In FIG. 20, a light-sensitive chip 110 is molded with milk-white resin 120. Color filters (not shown) made from polyimide resin are applied on the light-receiving surface of the light-sensitive chip 110, as explained above though details are ommited for simplicity. The light-sensitive chip 110 is bonded with a layer 140 of an electric conductive bonding agent on a tab 131 which is located at the center of a lead frame 130, similar to that shown in FIG. 2, by using a die bonding process. An end of each bonding wire 150 is connected to each inner lead terminal 132 of the lead frame 130, while the other end of each bonding wire 150 is connected to each bonding pad of the light-sensitive chip 110. Each outer lead 133 of the lead frame 130 connected electrically to the corresponding inner lead 132 is a lead of the light-sensitive device to the external.

After the wire bonding is complete, resin molding which is characterized by the use of milk resin is processed with the transfer molding or other processes mentioned above. In other words, a mixture of transparent acrylic resin, epoxy resin or silicon resin with titanium oxide or barium sulfate is used as a milk-white resin. In the transfer molding process, the operating temperature is about 180° C. at most, so that the organic pigment and the polyimide resin of color filters can resist the heating well.

In a light-sensitive device molded with use of milk-white resin, the incident light diffuses in the resin mold 120 so that the light is homogenized on the surface of the color filter applied on the light-sensitive regions of the chip 110. Therefore, no diffuser plate is needed though an infrared rays cut-off filter 191 is needed in order to cut off infrared components of the incident light.

Though the above-mentioned embodiments relate to a white-balance sensor, a light-sensitive device according to the present invention can also be applied, for example, to an integrated-circuit chip having a light-sensitive element and a process circuit on a common chip, a sensor for the measurement of brightness, a two-dimensional image sensor (a solid image sensor such as CCD or MOS) and a sensor for colorimetry.

Color filters according to the present invention can also be used for display devices such as a color liquid-crystal display or a color liquid-crystal television set.

The preferred embodiments described herein are illustrative and not restrictive, the scope of the invention being indicated by the appended claims and all variations which come within the meanings of the claims are intended to be embraced herein.

What is claimed is:

1. A light-sensitive device comprising:
    a light-sensitive element having a surface for receiving an incident light; and
    a color filter made from polyimide resin mixed with organic pigment, said color filter adhering to the surface of said light-sensitive element.

2. A light-sensitive device according to claim 1, wherein said organic pigment is a quinacridone pigment.

3. A light-sensitive device according to claim 1, wherein said organic pigment is a phthalocyanine green pigment.

4. A light-sensitive device according to claim 1, wherein said organic pigment is a phthalocyanine blue pigment.

5. A light-sensitive device according to claim 1, wherein said polyimide resin is a polymer of a general formula wherein $R_1$ represents an aromatic hydrocarbon nucleus or a heterocyclic nucleus and $R_2$ represents either of a hydrogen atom and hydrocarbon group of the number of carbon from one to ten.

6. A light-sensitive device according to claim 5, wherein said organic pigment is a quinacridone pigment.

7. A light-sensitive device according to claim 6, wherein said polyimide resin is mixed with said pigment in the ratio of weight between 1:0.1 and 1:3.

8. A light-sensitive device according to claim 5, wherein said organic pigment is a phthalocyanine green pigment.

9. A light-sensitive device according to claim 8, wherein said polyimide resin is mixed with said pigment in the ratio of weight between 1:0.1 and 1:3.

10. A light-sensitive device according to claim 5, wherein said organic pigment is a phthalocyanine blue pigment.

11. A light-sensitive device according to claim 10, wherein said polyimide resin is mixed with said pigment in the ratio of weight between 1:0.1 and 1:3.

12. A light-sensitive device according to claim 1, wherein said polyimide resin is a polymer of a general formula wherein $R_3$ represents an aromatic hydrocarbon nucleus or a heterocyclic nucleus and $R_4$ represents either of an hydrogen atom and a hydrocarbon group of the number of carbon from one to ten.

13. A light-sensitive device according to claim 12, wherein said organic pigment is a quinacridone pigment.

14. A light-sensitive device according to claim 13, wherein said polyimide resin is mixed with said pigment in the ratio of weight between 1:0.1 and 1:3.

15. A light-sensitive device according to claim 12, wherein said organic pigment is a phthalocyanine green pigment.

16. A light-sensitive device according to claim 15, wherein said polyimide resin is mixed with said pigment in the ratio of weight between 1:0.1 and 1:3.

17. A light-sensitive device according to claim 12, wherein said organic pigment is a phthalocyanine blue pigment.

18. A light-sensitive device according to claim 17, wherein said polyimide resin is mixed with said pigment in the ratio of weight between 1:0.1 and 1:3.

19. A light-sensitive device according to claim 1, wherein said polyimide resin is a polymer of a general formula wherein $R_5$ represents an aromatic hydrocarbon nucleus or a heterocyclic nucleus and $R_6$ represents either of a hydrogen atom and a hydrocarbon group of the number of carbon from one to ten.

20. A light-sensitive device according to claim 19, wherein said organic pigment is a quinacridone pigment.

21. A light-sensitive device according to claim 20, wherein said polyimide resin is mixed with said pigment in the ratio of weight between 1:0.1 and 1:3.

22. A light-sensitive device according to claim 19, wherein said organic pigment is a phthalocyanine green pigment.

23. A light-sensitive device according to claim 22, wherein said polyimide resin is mixed with said pigment in the ratio of weight between 1:0.1 and 1:3.

24. A light-sensitive device according to claim 19, wherein said organic pigment is a phthalocyanine blue pigment.

25. A light-sensitive device according to claim 24, wherein said polyimide resin is mixed with said pigment in the ratio of weight between 1:0.1 and 1:3.

26. A light-sensitive device comprising:
a plurality of light-sensing elements, each light-sensing element having a surface for receiving an incident light; and
a plurality of color filters made from polyimide resin mixed with organic pigment, said color filters adhering to said light-sensitive elements, respectively.

27. A light-sensitive device according to claim 26, wherein said color filters are formed to transmit lights whose wavelengths are different from one another.

28. A light-sensitive device according to claim 27, comprising three light-sensitive elements and three color filters.

29. A light-sensitive device comprising:
a light-sensitive element having a surface for receiving an incident light;
a color filter made from polyimide resin mixed with an organic pigment, said color filter adhering to the surface of said light-sensitive element; and
as transparent film having a flat surface for coating said color filter.

30. A light-sensitive device according to claim 29, wherein said transparent film is made from polyimide resin.

31. A light-sensitive device comprising:
a chip including a light-sensitive portion having a surface for receiving an incident light;
a color filter made from polyimide resin mixed with organic pigment, said color filter adhering to the surface of the light-sensitive portion; and a packaging member made from a light-transmitting material, said member molding a whole top and a whole side of said chip.

32. A light-sensitive device according to claim 31, wherein said light-transmitting material is a transparent resin.

33. A light-sensitive device according to claim 32, wherein said transparent resin is an acyrlic resin, an epoxy resin or a silicon resin.

34. A light-sensitive device according to claim 31, wherein said light-transmitting material is a milk-white resin.

35. A light-sensitive device according to claim 34, wherein said milk-white resin is a mixture of transparent acrylic resin, an epoxy resin or a silicon resin with titanium oxide.

36. A light-sensitive device according to claim 34, wherein said milk-white resin is a mixture of transparent acrylic resin, an epoxy resin or a silicon resin with barium sulfate.

37. A light-sensitive device according to claim 31, further comprising:
a conductor jutting out from said packaging member;
a connecting means for connecting said chip and said conductor;
wherein said connecting means is also molded by said packaging member.

38. A light-sensitive device according to claim 37, wherein said connecting means is a bonding wire for wire-bonding.

39. A manufacturing method of a light-sensitive device having a light-sensitive region, comprising the steps of:
(a) extending liquid polyimide resin mixed with organic pigment on a surface of the light-sensitive region formed on a wafer of a semiconductor material;
(b) hardening the extended liquid;
(c) dicing said waver into individual chips;
(d) bonding one of said chips to a lead frame member having electrical lead means;
(e) bonding electrical wires between said chip and the electrical lead means of the lead frame member for connecting to at least one external device; and
(f) molding said chip bonded to said lead frame member with a resin. with a resin.

40. A manufacturing method according to claim 39, wherein said bonding of electrical wires makes use of a thermal wire-bonding process.

41. A manufacturing method according to claim 40, wherein said thermal wire-bonding process is the thermocompression process.

42. A manufacturing method according to claim 40, wherein said bonding of electrical wires makes use of the thermosonic process.

43. A manufacturing method according to claim 40, wherein said bonding of electrical wires makes use of the laser-bonding process.

44. A manufacturing method according to claim 40, wherein said bonding of electrical wires makes use of the solder-bonding process.

45. A manufacturing method according to claim 40, wherein said molding makes use of the transfer molding process.

46. A manufacturing method according to claim 40, wherein said bonding of electrical wires makes use of the injection molding process.

47. A manufacturing method according to claim 40, wherein said bonding of electrical wires makes use of the casting-potting process.

48. A manufacturing method according to claim 39, wherein said extending step is a spinner-coating process.

49. A light-sensitive device comprising:
a light-sensitive element having a surface for receiving an incident light;
a color filter made from polyimide resin mixed with an organic pigment, applied to the light-receiving surface of said light-sensitive element; and
a conductor connected to said light-sensitive element by a wire formed by a thermal wire-bonding process.

50. A light-sensitive device according to claim 49, wherein the thermal wire-bonding process is a thermocommpression process.

51. A light-sensitive device according to claim 49, wherein the thermal wire-bonding process is a thermosonic process.

52. A light-sensitive device according to claim 49, wherein the thermal wire-bonding process is a laser-bonding process.

53. A light-sensitive device according to claim 49, wherein the thermal wire-bonding process is a solder-bonding process.

* * * * *